(12) United States Patent
Bo

(10) Patent No.: US 6,856,146 B2
(45) Date of Patent: Feb. 15, 2005

(54) CAPACITANCE PROBE FOR SURFACE DIELECTRIC CONSTANT MEASUREMENTS

(75) Inventor: Tien-I Bo, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 81 days.

(21) Appl. No.: 10/291,004

(22) Filed: Nov. 7, 2002

(65) Prior Publication Data

US 2004/0100288 A1 May 27, 2004

(51) Int. Cl.[7] .................... G01R 27/26; G01R 31/26
(52) U.S. Cl. ................... 324/687; 324/663; 324/719
(58) Field of Search .................. 324/719, 687, 324/686, 690, 693, 658, 660, 662, 601, 765, 458, 663; 73/304 C, 335.03–335.06

(56) References Cited

U.S. PATENT DOCUMENTS

| | | | | |
|---|---|---|---|---|
| 4,935,700 A | * | 6/1990 | Garbini et al. | 324/687 |
| 5,767,687 A | * | 6/1998 | Geist | 324/664 |
| 6,456,082 B2 | * | 9/2002 | Nowak et al. | 324/458 |
| 6,490,920 B1 | * | 12/2002 | Netzer | 73/304 C |
| 2003/0090277 A1 | * | 5/2003 | Lechner et al. | 324/686 |

* cited by examiner

Primary Examiner—Jay Patidar
Assistant Examiner—Amy He
(74) Attorney, Agent, or Firm—Tung & Associates

(57) ABSTRACT

A fringing capacitance measurement probe and a method for determining a surface dielectric constant. The fringing capacitance measurement probe includes a planarized surface probe element for making interfacial planar contact with a measurement surface, the planarized surface having a metal conductive line portion and an insulating area portion to form a measuring area. The perimeter portion of the metal conductive line portion has a length greater than the perimeter length of the measuring area such that a fringing capacitance of the measurement surface may be determined.

19 Claims, 2 Drawing Sheets

CAPACITANCE PROBE FOR SURFACE DIELECTRIC CONSTANT MEASUREMENTS

FIELD OF THE INVENTION

This invention generally relates to capacitance probes and more particularly to a method and apparatus for determining a surface dielectric constant of a semiconductor wafer process surface.

BACKGROUND OF THE INVENTION

In semiconductor fabrication, various layers of insulating material, semiconducting material and conducting material are formed to produce a multilayer (multilevel) semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

Since the introduction of semiconductor devices, the size of semiconductor devices has been continuously shrinking, resulting in smaller semiconductor chip size and increased device density. One of the limiting factors in the continuing evolution toward smaller device size and higher density has been signal delay caused by parasitic capacitive effects of insulating materials in which metal interconnects are formed to interconnect devices. It has become necessary to reduce the capacitance of insulating layers by allowing insulating layer thicknesses to shrink along with other device features such as metal interconnect line widths. As a result, the need for lower dielectric constant materials has resulted in the development of several different types of organic and inorganic low-k materials.

Manufacturing processes such as, for example, damascene processes, have been implemented to form metallization vias and interconnect lines (trench lines) by dispensing entirely with the metal etching process. The damascene process is a well known semiconductor fabrication method for forming multiple levels of metallization vias and interconnect lines (trench lines). For example, in the dual damascene process, a trench opening and via opening are etched in an insulating layer also known as an inter-metal or inter-level dielectric (IMD/ILD) layer. The insulating layer is typically formed over a substrate including another conductive area over which the vias and trench lines are formed and in communication with. After a series of photolithographic steps defining via openings and trench openings, the via and the trench openings are filled with a metal, preferably copper, to form metallization vias and interconnect lines (trench lines), respectively. The excess metal above the trench line level is then removed by well known chemical-mechanical planarization (polishing) (CMP) processes.

As indicated, advances in semiconductor device processing technology demands the increasing use of low-k (low dielectric constant) insulating materials in, for example, IMD (ILD) layers that make up the bulk of a multilayer device. In order to reduce signal delays caused by parasitic effects related to the capacitance of insulating layers, for example, IMD layers, incorporation of low-k materials has become standard practice as semiconductor feature sizes have diminished. Many of the low-k materials are designed with a high degree of porosity to allow the achievement of lower dielectric constants. Several different organic and inorganic low-k materials have been developed and proposed for use in semiconductor devices as insulating material having dielectric constants less than about 3.0 for achieving integration of, for example, 0.13 micron interconnections. In the future, even lower dielectric constant material, for example less than about 2.5, will be required for 0.1 micron process integration, and dielectric constants of less than about 2.0 will be required for 0.07 micron process integration.

One exemplary low-k inorganic material that is frequently used, for example, is carbon doped silicon dioxide (C-oxide) formed by a CVD process where the dielectric constant may be varied over a range depending on the process conditions. Carbon doped oxide, for example, may be formed with dielectric constants over a range of about 2.0 to about 3.0 and density of about 1.3 $g/cm^3$ compared to dielectric constants of about 4.1 and a density of about 2.3 $g/cm^3$ for silicon dioxides (e.g., un-doped TEOS). Other exemplary low-k inorganic materials include porous oxides, xerogels, or SOG (spin-on glass). Exemplary low-k organic materials include polysilsequioxane, parylene, polyimide, benzocyclobutene and amorphous Teflon.

One problem with low-k materials is that frequently during semiconductor processing, including chemical mechanical polishing (CMP), plasma etching, and isotropic wet etching processes, the surface of the low-k material is damaged. The damage to the surface of the low-k material can significantly alter the surface dielectric constant resulting in a relatively higher dielectric constant at the surface compared to the bulk. There are presently available various methods to obtain the bulk dielectric constant of low-k insulating layer by passing an electric field through the bulk of the low-k material to measure the bulk capacitance of the low-k material.

For example, one method to measure bulk capacitance during semiconductor device manufacture is to fabricate on the wafer a large capacitor having a value in excess of 1 picofarad. A capacitor of this size is necessary because of the various stray capacitances which exist in and on the wafer and which are measured along with the test capacitance. One plate of the capacitor under test is coupled to at least one large "testing" contact or pad to allow a test probe to access the capacitor.

However, bulk capacitance measurement methods involve time consuming ex-situ measurements and it is not possible to reliably extract surface dielectric constant information using such methods. Surface dielectric constant information is useful including use of a non-destructive probe to optimize the various semiconductor manufacturing processes in order to minimize adverse effects on low-k material surfaces. In addition, methods for quickly and easily obtaining the surface dielectric constants, for example, in-situ, would increase cycle times and throughput in semiconductor wafer manufacturing.

There is therefore a need in the semiconductor processing art to develop a method and apparatus for determining the surface dielectric constant of low-k material layers whereby a semiconductor wafer process surface condition may be quickly and readily obtained.

It is therefore an object of the invention to provide a method and apparatus for determining the surface dielectric constant of low-k material layers whereby a semiconductor wafer process surface condition may be quickly and readily obtained while overcoming other shortcomings and deficiencies of the prior art.

SUMMARY OF THE INVENTION

To achieve the foregoing and other objects, and in accordance with the purposes of the present invention, as embodied and broadly described herein, the present invention provides a fringing capacitance measurement probe and method for determining a surface dielectric constant.

In a first embodiment, a fringing capacitance measurement probe is provided including a planarized surface probe element for making interfacial planar contact with a measurement surface said planarized surface having a metal conductive line portion and an insulating area portion to form a measuring area a perimeter portion of the metal conductive line portion having a length greater than a perimeter length of the measuring area such that a fringing capacitance of the measurement surface may be determined.

In another embodiment, a method of determining a fringing capacitance to determine a surface dielectric constant of a dielectric insulating layer included in a semiconductor device includes providing a first planarized surface for making interfacial planar contact with a measurement surface said planarized surface including a metal conductive line portion and an insulating area portion a perimeter portion of the metal conductive line portion having a length greater than about at least a factor of five compared to a perimeter length of the planarized surface probe element, the metal conductive line portion in electrical contact with a metal backing portion forming a second planarized surface parallel to the first planarized surface and spaced apart therefrom to form a fringing capacitance probe; forming interfacial contact between the first planarized surface and the measurement surface; providing electrical communication between a means for determining a capacitance of the fringing capacitance probe and the measurement surface; measuring the capacitance; and, subtracting that portion of the capacitance attributable to the fringing capacitance probe to determine a fringing capacitance proportional to a surface dielectric constant.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

According to the present invention, a fringing capacitance probe with a high perimeter area conductive metal line is described for making surface capacitance measurements to determine a fringing capacitance and thereby a surface dielectric constant. In contrast to typical bulk capacitance measurements to determine a bulk dielectric constant, where the measured capacitance has two separate components: (1) the capacitance due to fringing effects, which is a function of the dielectric material's perimeter in contact with a measuring electrode perimeter, and (2) the capacitance due to the thickness of the dielectric material, which is a function of the dielectric material's area, the apparatus and method of the present invention determines a fringing capacitance where the capacitance contribution from the dielectric material area may be neglected. In the fringing capacitance probe of the present invention, a metal conductive line electrode having a large perimeter with respect to a contact measuring surface perimeter allows a fringing capacitance to be measured and a surface dielectric constant to be determined.

Figure 1A:
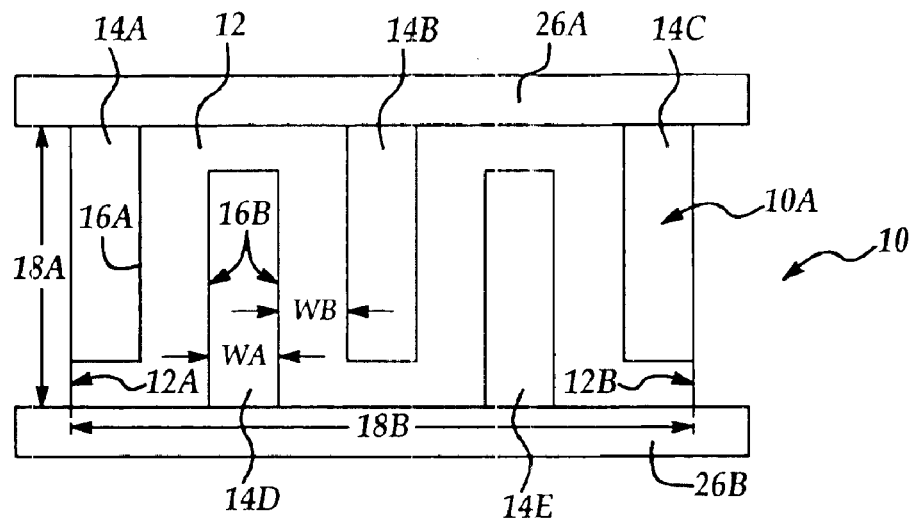
FIGS. 1A–1C are various views of an exemplary embodiment of the fringing capacitance probe according to the present invention.

In one embodiment, referring to FIG. 1A, is shown a head-on view of the contact measuring surface 10A of the fringing capacitance probe 10, having an electrically conductive metal line, e.g., 12 formed within a dielectric insulating material to separate well defined areas of dielectric insulating materials e.g., 14A, 14B, 14C, 14D, 14E, for defining a probe capacitance. The contact measuring surface 10A includes a planarized surface having a conductive metal line perimeter portion e.g., 16A, 16B. The conductive metal line perimeter portion e.g., 16A, 16B preferably has an extended perimeter length sufficiently greater compared to the contact measuring surface perimeter, e.g., 18A and 18B to allow a fringing capacitance to be determined. For example, in one embodiment, the sum of the conductive line perimeter portions e.g., 16A, 16B is greater by at least about a factor of five compared to the contact measuring surface perimeter e.g., 18A, 18B. The metal line may be formed of any conductive metal, but is preferably a metal compatible with known semiconductor manufacturing processes, for example, tungsten, copper, copper alloys, and aluminum. Preferably, the insulating material forming insulating area portions, e.g., 14A, 14B, 14C, 14D, 14E, is preferably an insulating dielectric material with a homogenous and known dielectric constant of less than about 3.5. Preferably, the insulating dielectric material is compatible with known semiconductor processes for forming dielectric insulating layers, for example, fluorosilicated glass, and carbon doped silicon dioxide. In addition, exemplary low-k organic materials that may be suitably used include polysilsesquioxane, parylene, polyimide, benzocyclobutene, and Teflon.

The conductive metal line 12 as shown in FIG. 1A is preferably formed in a serpentine shape, for example, a square wave shape in order to reliably determine the perimeter length and the insulating area portion. It will be appreciated that there are a variety of serpentine structure shapes that may be suitably used to form a conductive line with an extended perimeter length, as long as the perimeter length and the insulating area portion are sufficiently defined. For example, the serpentine shape may include a sine wave shape or a saw wave shape. In the exemplary embodiment of a square wave structure for the metal conductive lines, the insulating areas e.g., 14A, 14B, 14C, 14D, 14E, are preferably formed having a width, e.g., WA about equal to the width, WB of the metal conductive line 12. Preferably, the fringing capacitance probe includes insulating supporting structures, e.g., 26A, 2B, disposed adjacent to at least two perimeter portions of the contact measuring surface 10A, preferably parallel to a serpentine path direction of the metal conductive line 12, and preferably at least about equal in width WB to the conductive metal line 12. The distal ends of the metal conductive line 12, e.g., 12A and 12B are preferably co-planer with insulating edge portions, e.g., 14A and 14C.

Figure 1B:
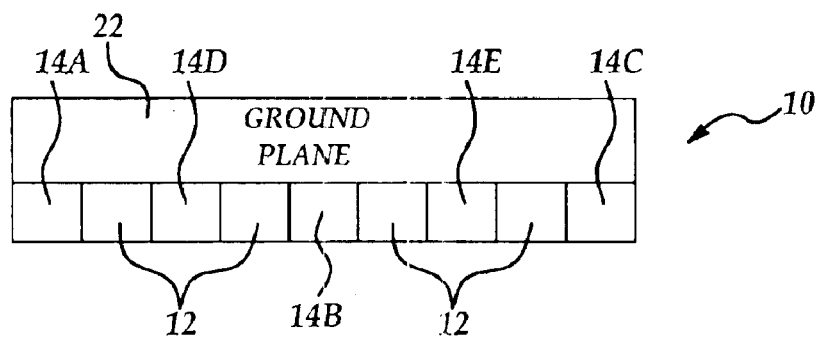

Referring to FIG. 1B is shown a cross sectional side view of the fringing capacitance probe 10 having a metal ground plane portion 22 in contact with the metal conductive line 12. The metal ground plane portion 22 is preferably contiguous with the metal conductive line 12 and formed of the same metal as metal conductive line 12 for more efficient manufacturing according to a semiconductor process as explained below.

Figure 1C:
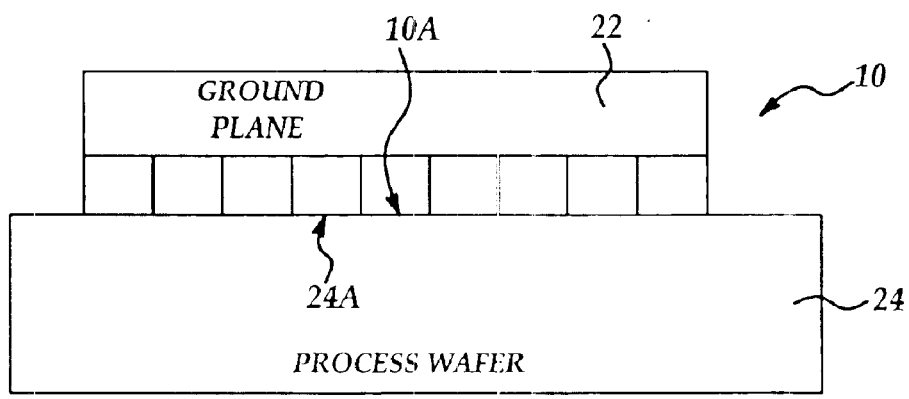

Referring to FIG. 1C is shown the fringing capacitance probe 10 having a planarized probe surface 10A, in contact with a portion of a semiconductor process wafer surface 24A of semiconductor wafer 24. In operation, the capacitance probe includes a capacitive contribution, C1 from the ground plane portion 22 and the metal conductive line 12 and a capacitive contribution, C2 from the insulating area portions e.g., 14A, 14B, 14C, 14D, and 14E. The semiconductor wafer includes a fringing capacitance contribution C3. In operation, C1 and C2 are known and may be subtracted from the total capacitance measurement C thus giving a fringing capacitance C3 according to C3=C−(C1+C2). A surface dielectric constant is then easily determined from the fringing capacitance as is known in the art.

In one embodiment, the capacitance probe is manufactured according to known semiconductor manufacturing methods. For example, the metal conductive line pattern may be manufactured according to photolithographic patterning of a metal layer to pattern the metal conductive line 12 followed by anisotropic metal etching to form the metal conductive line 12 in contact with the ground plane portion 22. Following formation of the metal conductive line 12, the gaps between the metal conductive line 12 may then be filled by a dielectric insulating material, for example, having a dielectric constant of less than about 3.5, including for example, fluorosilicated glass (FSG). For example, the dielectric material may be deposited by HDP-CVD (high density plasma chemical vapor deposition), PECVD (plasma enhanced CVD), or spin coating process including for example spin on glass (SOG). Following deposition of the dielectric material, the contact measuring surface 10A is preferably planarized according to a chemical mechanical polishing (CMP) process or a plasma etchback process, such methods well known in the semiconductor manufacturing art.

Alternatively, the metal conductive line may be formed by first forming a dielectric layer followed by photolithographic patterning and anisotropic etching the dielectric layer to form an opening conforming to the metal conductive line 12 in the dielectric layer. Metal is then be deposited within the opening by various processes including PVD, CVD, or electroplating, followed by a planarization process to planarize the contact measuring surface 10A and define the metal conductive line 12. Metals such as tungsten, aluminum, copper and the like, for which typical semiconductor manufacturing processes have been optimized are preferably used to form the metal conductive line 12. An adhesion/barrier metal nitride layer, for example titanium nitride or tantalum nitride to improve adhesion between the metal conductive line and the insulating dielectric and to prevent diffusion of the metal into the insulating dielectric layer may be optionally deposited conformally within the metal conductive line opening prior to filling with metal.

It will be appreciated that a plurality of the fringing capacitance probes may be formed into an array to provide multiple sequential fringing capacitance measurements covering a portion of the semiconductor wafer surface. While it will be appreciated that the particular width of the metal conductive lines and the perimeter of the contact measuring surface may vary depending on the value of the fringing capacitance desired to be measured and the area over which the fringing capacitance is desired, preferably, each fringing capacitance probe is preferably designed to measure a value of at least 1 picofarad with an accuracy of about plus or minus 10 percent.

Figure 2:
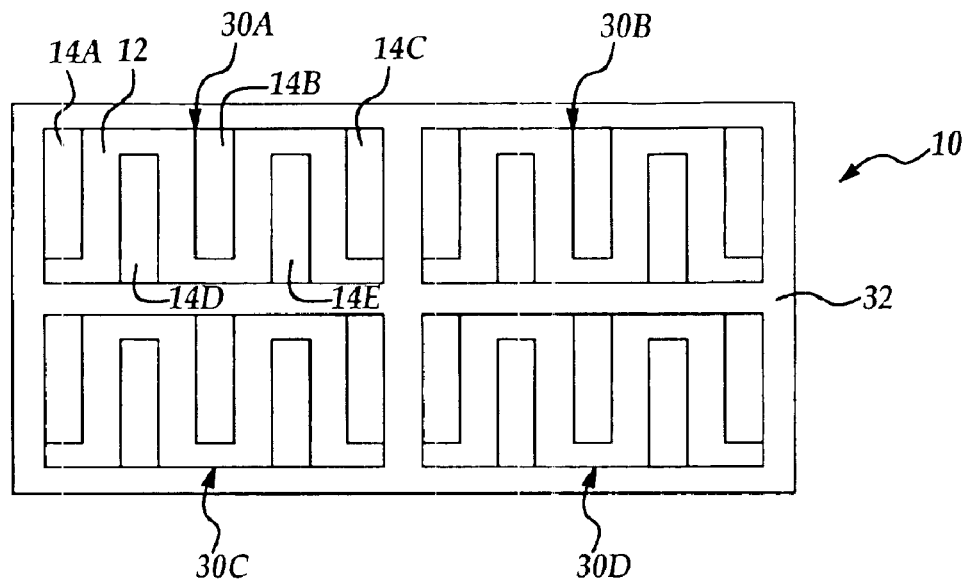
FIG. 2 is a representation of the measuring contacting surface of a plurality of ringing capacitance probes forming an array for carrying out sequential or simultaneous capacitance measurements according to embodiments of the present invention.

For example, referring to FIG. 2 is shown an array of fringing capacitance probes 30 formed by arranging the plurality of fringing capacitance probes, for example, disposed adjacently to one another to form a matrix of several fringing capacitance probes, e.g., 30A, 30B, 30C, 30D. The individual capacitance probes are preferably surrounded by an insulating supporting structure area e.g., 32 to minimize overlapping fringing capacitance contributions. Preferably, a width of the insulating supporting structure is at least about equal to the width of the metal conductive line 12. In one embodiment, an array of fringing capacitance probes may be preferably arranged to cover a surface area measurement. For example, the array of fringing capacitance probes may be formed on a semiconductor wafer simultaneously, similar to simultaneously forming several die or individual semiconductor devices according to known semiconductor device manufacturing methods. The various fringing capacitance probes may either be separated after manufacture in a sawing and dicing operation as is known in the semiconductor wafer manufacturing art to be later used individually, or assembled into an array for sequential capacitance measurements. Alternatively, the fringing capacitance probe array may be left intact on a semiconductor wafer or a sawed and diced portion thereof to form an intact array of capacitance probes for conducting simultaneous or sequential individual measurements.

The capacitance probes may be interfaced with AC or DC voltage sources for making capacitance measurements as will be appreciated by those skilled in the art. For example, in one exemplary embodiment, the capacitance probe may be interfaced in electrical communication with an impedance analyzer for single frequency (including DC) or frequency swept measurements, for example up to about 5 MHZ. As will be appreciated by those skilled in the art, automated procedures may be used to make measurements including determining and subtracting, for example (C1+C2) as previously explained to determine a fringing capacitance and thereby a surface dielectric constant. In addition, the capacitance probe or array of capacitance probes may be interfaced with means for remote positioning, for example, an automated stepping robotic arm for automating the remote positioning of the capacitance probe or array of capacitance probes to contact the semiconductor wafer surface to, for example, carry out in-situ (e.g., controlled ambient) capacitance measurements.

Figure 3:
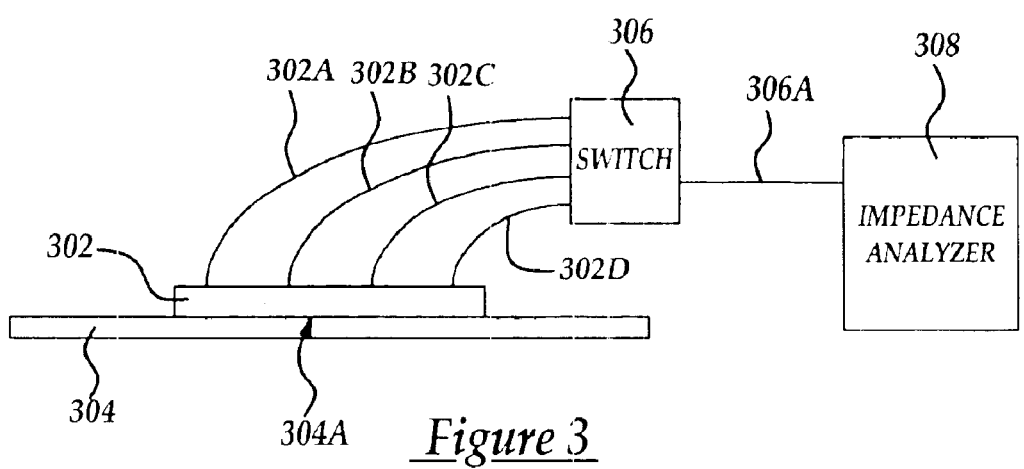
FIG. 3 is a schematic representation of an arrangement for carrying out sequential capacitance measurements using an array of fringing capacitance probes according to an embodiment of the present invention.

For example, referring to FIG. 3 is shown an array of capacitance probe elements 302 forming a matrix of capacitance probe elements in contact with semiconductor wafer 304 at semiconductor wafer surface 304A. The individual capacitance probe elements are each in electrical communication via electrical communication lines e.g., 302A, 302B, 302C, 302D to a low current matrix switching element 306 for sequentially making electrical communication with, for example, an impedance analyzer, 308, via electrical communication line e.g., 306A. Measurements to determine a capacitance may include, for example, making a single capacitance measurement at a single frequency, including DC, or a swept frequency measurement, a capacitance being determined at each swept signal frequency. As will be appreciated by those skilled in the art, several commercially available impedance analyzers and signal switching apparatus are suitable for making such measurements. In addition, automated procedures are easily implemented for determining the fringing capacitance i.e., according to C3=C−(C1+C2) using the fringing capacitance probe according to the present invention as explained earlier. In operation, following a sequential series of fringing capacitance measurements by the individual capacitance probe elements forming the array of probe elements 302, an adjustable remote manipulation means, for example, robotic positioning arm (not shown) may be used to raise and reposition the array of probe elements 302 to contact a second portion of the semiconductor wafer surface 304A to make another series of sequential measurements to determine a fringing capacitance and thereby a surface dielectric constant at the semiconductor wafer surface.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A fringing capacitance measurement probe for determining a surface dielectric constant of a semiconductor process wafer comprising:

a planarized surface probe element for making interfacial planar contact with a dielectric measurement surface;

said planarized surface having a metal conductive line portion comprising a measurement electrode and an insulating area portion to form a measuring area;

wherein said metal conductive line portion comprises a serpentine shape having a continuous length greater than a perimeter length of the measuring area such that a fringing capacitance of the measurement surface may be determined.

2. The fringing capacitance measurement probe of claim 1, wherein the continuous length of the metal conductive line portion is at least about 5 times greater than the perimeter length.

3. The fringing capacitance measurement probe of claim 1, wherein the metal conductive line portion is formed within the insulating portion to maximize the continuous length of the metal conductive line portion.

4. The fringing capacitance measurement probe of claim 3, wherein the serpentine shape is selected from the group consisting of a square wave shape, a saw wave shape, and a sine wave shape.

5. The fringing capacitance measurement probe of claim 1, wherein the metal conductive line portion contacts a metal backing portion for forming electrical communication with an impedance measuring device.

6. The fringing capacitance measurement probe of claim 1, wherein a plurality of fringing capacitance measurement probes are adjacently arranged to form an array.

7. The fringing capacitance measurement probe of claim 6, wherein each of the plurality of fringing capacitance measurement probes are arranged in electrical communication with a signal switching element for forming sequential electrical communication with an impedance measuring device for determining a capacitance.

8. The fringing capacitance measurement probe of claim 7, wherein the impedance measuring device comprises a signal selected from the group consisting of a direct current signal and alternating current signal.

9. The fringing capacitance measurement probe of claim 7, wherein the impedance measuring device comprises a means for making swept frequency impedance measurements.

10. The fringing capacitance measurement probe of claim 6, wherein the array is interfaced with a means for remotely positioning the array to contact the measuring surface.

11. A method of determining a fringing capacitance to determine a surface dielectric constant of a dielectric insulating layer comprising a semiconductor device comprising the steps of;

providing a first planarized surface for making interfacial planar contact with a measurement surface;

said planarized surface comprising a metal conductive line portion comprising a measuring electrode and an insulating area portion wherein the metal conductive line portion comprises a serpentine shape having a continuous length greater than a perimeter length of the planarized surface;

wherein the metal conductive line portion is positioned in electrical contact with a metal backing portion to form a fringing capacitance probe;

forming interfacial contact between the first planarized surface and the measurement surface;

measuring a capacitance of the fringing capacitance probe and the measurement surface; and, subtracting that portion of the capacitance attributable to the fringing capacitance probe to determine the measurement surface dielectric constant.

12. The method of claim 11, wherein the serpentine shape is selected from the group consisting of a square wave shape, a saw wave shape, and a sine wave shape.

13. The method of claim 11, wherein the step of providing a first planarized surface comprises;

providing a metal substrate;

photolithographically patterning the metal substrate for forming the metal conductive line portion;

etching the metal substrate to form the metal conductive line portion;

forming a dielectric insulating layer over the metal conductive line portion; and, planarizing the dielectric insulating layer to expose the metal conductive line portion surface to form the first planarized surface.

14. The method of claim 11, wherein the step of providing a first planarized surface comprises;

providing an dielectric insulating layer formed over a metal substrate for forming the metal conductive line portion;

photolithographically patterning the dielectric insulating layer for forming an opening comprising the metal conductive line portion;

etching the dielectric insulating layer to form the opening;

filling the opening with metal; and, planarizing the dielectric insulating layer to expose the metal conductive line portion surface to form the first planarized surface.

15. The method of claim 11, wherein a plurality of fringing capacitance probes are adjacently arranged to form an array.

16. The method of claim 15, wherein each of the plurality of fringing capacitance probes are arranged in electrical communication with a signal switching element for forming sequential electrical communication with the means for measuring the capacitance.

17. The method of claim 11, wherein the means for measuring the capacitance comprises swept frequency measurements.

18. The method of claim 11, wherein the step of forming interfacial contact through the step of determining a fringing capacitance are repeated.

19. The method of claim 18 wherein the step of forming interfacial contact comprises remotely and adjustably covering the measuring surface to determine a surface dielectric constant.

* * * * *